(12) United States Patent
Izumi et al.

(10) Patent No.: US 8,129,785 B2
(45) Date of Patent: Mar. 6, 2012

(54) SEMICONDUCTOR DEVICE

(75) Inventors: Naoki Izumi, Kyoto (JP); Tomoyasu Sada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 13 days.

(21) Appl. No.: 12/285,014

(22) Filed: Sep. 26, 2008

(65) Prior Publication Data

US 2009/0085113 A1 Apr. 2, 2009

(30) Foreign Application Priority Data

Sep. 28, 2007 (JP) ................................. 2007-255346

(51) Int. Cl.
*H01L 29/78* (2006.01)

(52) U.S. Cl. ................. 257/343; 257/335; 257/E29.261; 257/E29.027

(58) Field of Classification Search .................. 257/335, 257/336, 343, 347, 141, 272, 401, 506, 409, 257/E29.027, E29.261, E29.066
See application file for complete search history.

(56) References Cited

U.S. PATENT DOCUMENTS

| | | | |
|---|---|---|---|
| 5,428,241 | A | 6/1995 | Terashima et al. |
| 2001/0025987 | A1* | 10/2001 | Akaishi et al. ................ 257/343 |
| 2006/0255406 | A1* | 11/2006 | Ichijo et al. .................. 257/347 |
| 2008/0197408 | A1* | 8/2008 | Disney et al. ................. 257/335 |
| 2008/0237706 | A1* | 10/2008 | Williams et al. .............. 257/343 |

FOREIGN PATENT DOCUMENTS

JP 2006-210943 8/2006

* cited by examiner

*Primary Examiner* — Victor A Mandala
*Assistant Examiner* — Whitney T Moore
(74) *Attorney, Agent, or Firm* — Rabin & Berdo, P.C.

(57) ABSTRACT

A semiconductor device according to the present invention includes: a semiconductor layer of a first conductivity type; an annular deep trench penetrating the semiconductor layer in the depth direction to surround an element forming region; a drain region of a second conductivity type formed in a surface layer portion of the semiconductor layer in the element forming region; a drift region of the second conductivity type formed in the surface layer portion of the semiconductor layer to come into contact with the drain region in the element forming region; a body region of the first conductivity type formed in the surface layer portion of the semiconductor layer at an interval from the drift region in the element forming region; a source region of the second conductivity type formed in a surface layer portion of the body region; and a first high-concentration buried region, formed in the semiconductor layer between a portion opposed to the source region in the depth direction and the deep trench, having a higher impurity concentration than that of the semiconductor layer.

12 Claims, 8 Drawing Sheets

SEMICONDUCTOR DEVICE

BACKGROUND OF THE INVENTION

1. Field of the Invention

The present invention relates to a semiconductor device including an LDMOSFET (Lateral Double diffused Metal Oxide Semiconductor Field-Effect Transistor).

2. Description of Related Art

An LDMOSFET employing a resurf structure is generally known as a MOSFET having a high withstand voltage.

FIG. 7 is a schematic sectional view of a semiconductor device 101 including an LDMOSFET employing a resurf structure.

A thick-film SOI (Silicon On Insulator) substrate 102 forming the base of the semiconductor device 101 has a structure formed by stacking an N-type epitaxial layer 105 made of Si (silicon) on a P-type silicon substrate 103 through a BOX (Buried Oxide) layer 104 made of $SiO_2$ (silicon oxide).

An annular deep trench 106 is dug in the epitaxial layer 105 from the surface thereof. The deepest portion of the deep trench 106 reaches the BOX layer 104. The deep trench 106 is filled up with polysilicon 108 through a silicon oxide film 107. Thus, the region surrounded by the deep trench 106 provides an element forming region isolated (dielectrically insulated) from the periphery thereof so that the LDMOSFET is formed thereon.

In the element forming region, a P-type drain buffer region 109 is formed in a surface layer portion of the epitaxial layer 105. A P-type drain contact region 110 having a higher P-type impurity concentration than that of the drain buffer region 109 is selectively formed in a surface layer portion of the drain buffer region 109.

A P-type drift region 111 is formed around the drain buffer region 109. The drift region 111 is in contact with the drain buffer region 109. A LOCOS oxide film 112 is formed on the overall drift region 111.

In the surface layer portion of the epitaxial layer 105, an N-type body region 113 is formed between the deep trench 106 and the drift region 111 at intervals therefrom. A P-type source region 114 and an N-type body contact region 115 having a higher N-type impurity concentration than that of the body region 113 are formed in a surface layer portion of the body region 113 adjacently to each other.

On the surface of the epitaxial layer 105, a gate oxide film 116 is formed between the source region 114 and the LOCOS oxide film 112. A gate electrode 117 is formed on the gate oxide film 116.

The thick-film SOI substrate 102 is covered with an interlayer dielectric film 118 made of $SiO_2$. A source wire 119 and a drain wire 120 are formed on the interlayer dielectric film 118. The source wire 119 is connected to the source region 114 and the body contact region 115 through a contact hole 121 formed in the interlayer dielectric film 118. The drain wire 120 is connected to the drain contact region 110 through another contact hole 122 formed in the interlayer dielectric film 118.

In this semiconductor device 101, an N-type high-concentration buried region 123 having a higher N-type impurity concentration (1E18 to $1E20/cm^3$, for example) than that of the epitaxial layer 105 is formed in the epitaxial layer 105 under the body region 113. The high-concentration buried region 123 has the same shape as the body region 113 in plan view.

When the source wire 119 is grounded and a negative voltage is applied to the drain wire 120, a depletion layer spreads from the boundary between the epitaxial layer 105 and the drift region 111. In the structure shown in FIG. 7, the high-concentration buried region 123 is so formed under the body region 113 that the depletion layer can be inhibited from extending in the lateral direction (direction orthogonal to the depth direction), whereby improvement of the withstand voltage can be expected.

If the negative voltage applied to the drain wire 120 is increased, however, a potential distribution shown in FIG. 8 is caused in the epitaxial layer 105 due to the low impurity concentration of the epitaxial layer 105, and the depletion layer passes under the high-concentration buried region 123 and extends toward the source region 114 through the portion between the high-concentration buried region 123 and the deep trench 106. In the structure (having the high-concentration buried region 123) shown in FIG. 7, therefore, increase of the withstand voltage of the LDMOSFET is limited.

SUMMARY OF THE INVENTION

An object of the present invention is to provide a semiconductor device capable of attaining a withstand voltage higher than that in the conventional structure.

A semiconductor device according to one aspect of the present invention includes: a semiconductor layer of a first conductivity type; an annular deep trench penetrating the semiconductor layer in the depth direction to surround an element forming region; a drain region of a second conductivity type formed in a surface layer portion of the semiconductor layer in the element forming region; a drift region of the second conductivity type formed in the surface layer portion of the semiconductor layer to come into contact with the drain region in the element forming region; a body region of the first conductivity type formed in the surface layer portion of the semiconductor layer at an interval from the drift region in the element forming region; a source region of the second conductivity type formed in a surface layer portion of the body region; and a first high-concentration buried region, formed in the semiconductor layer between a portion opposed to the source region in the depth direction and the deep trench, having a higher impurity concentration than that of the semiconductor layer.

In this semiconductor device, the annular deep trench is formed on the semiconductor layer of the first conductivity type. In the element forming region surrounded by the deep trench, the drain region and the drift region of the second conductivity type are formed in the surface layer portion of the semiconductor layer. Further, the body region of the first conductivity type is formed in the surface layer portion of the semiconductor layer at an interval from the drift region. The source region of the second conductivity type is formed in the surface layer portion of the body region. In the semiconductor layer, the first high-concentration buried region having a higher impurity concentration than that of the semiconductor layer is formed between the portion opposed to the source region in the depth direction and the deep trench.

The first high-concentration buried region is so formed that a depletion layer can be inhibited from extending toward the source region from the portion between the portion opposed to the source region in the depth direction and the deep trench. Therefore, a withstand voltage higher than that of the conventional structure shown in FIG. 7 can be attained.

The first high-concentration buried region may be in contact with the deep trench. In this case, no space is defined between the first high-concentration buried region and the deep trench, and hence the depletion layer can be inhibited from extending toward the source region through the first high-concentration buried region and the deep trench. Thus, a withstand voltage higher than that of the conventional structure shown in FIG. 7 can be reliably attained.

The semiconductor device may further include a second high-concentration buried region, opposed to the first high-concentration buried region at an interval in the depth direction in the semiconductor layer, having a higher impurity concentration than that of the semiconductor layer. In this case, the first and second high-concentration buried regions can inhibit the depletion layer from extending toward the deep trench beyond these regions, whereby a withstand voltage higher than that of the structure including no second high-concentration buried region can be attained.

A semiconductor device according to another aspect of the present invention includes: a semiconductor layer of a first conductivity type; an annular deep trench penetrating the semiconductor layer in the depth direction to surround an element forming region; a drain region of a second conductivity type formed in a surface layer portion of the semiconductor layer in the element forming region; a drift region of the second conductivity type formed in the surface layer portion of the semiconductor layer to come into contact with the drain region in the element forming region; a body region of the first conductivity type formed in the surface layer portion of the semiconductor layer at an interval from the drift region in the element forming region; a source region of the second conductivity type formed in a surface layer portion of the body region; a first high-concentration buried region, formed in the semiconductor layer on a portion opposed to the source region in the depth direction, having a higher impurity concentration than that of the semiconductor layer; and a second high-concentration buried region, opposed to the first high-concentration buried region at an interval in the semiconductor layer, having a higher impurity concentration than that of the semiconductor layer.

In this semiconductor device, the annular deep trench is formed on the semiconductor layer of the first conductivity type. In the element forming region surrounded by the deep trench, the drain region and the drift region of the second conductivity type are formed in the surface layer portion of the semiconductor layer. Further, the body region of the first conductivity type is formed in the surface layer portion of the semiconductor layer at an interval from the drift region. The source region of the second conductivity type is formed in the surface layer portion of the body region. In the semiconductor layer, the first and second high-concentration buried regions having higher impurity concentrations than that of the semiconductor layer are formed. The first high-concentration buried region is formed on the portion opposed to the source region in the depth direction, and the second high-concentration buried region is formed to be opposed to the first high-concentration buried region at an interval.

When the second high-concentration buried region is opposed to the first high-concentration buried region in the depth direction, the first and second high-concentration buried regions can inhibit a depletion layer from extending toward the deep trench beyond these regions.

When the first high-concentration buried region is formed at an interval from the deep trench and the second high-concentration buried region is formed between the first high-concentration buried region and the deep trench, the depletion layer can be inhibited from extending toward the source region from the portion between the first high-concentration buried region and the deep trench.

Thus, the first and second high-concentration buried regions are so formed that the depletion layer can be inhibited from extending toward the source region, whereby a withstand voltage higher than that of the conventional structure shown in FIG. 7 can be attained.

The foregoing and other objects, features and effects of the present invention will become more apparent from the following detailed description of the embodiments with reference to the attached drawings.

DETAILED DESCRIPTION OF PREFERRED EMBODIMENTS

Embodiments of the present invention are now described in detail with reference to the attached drawings.

Figure 1:
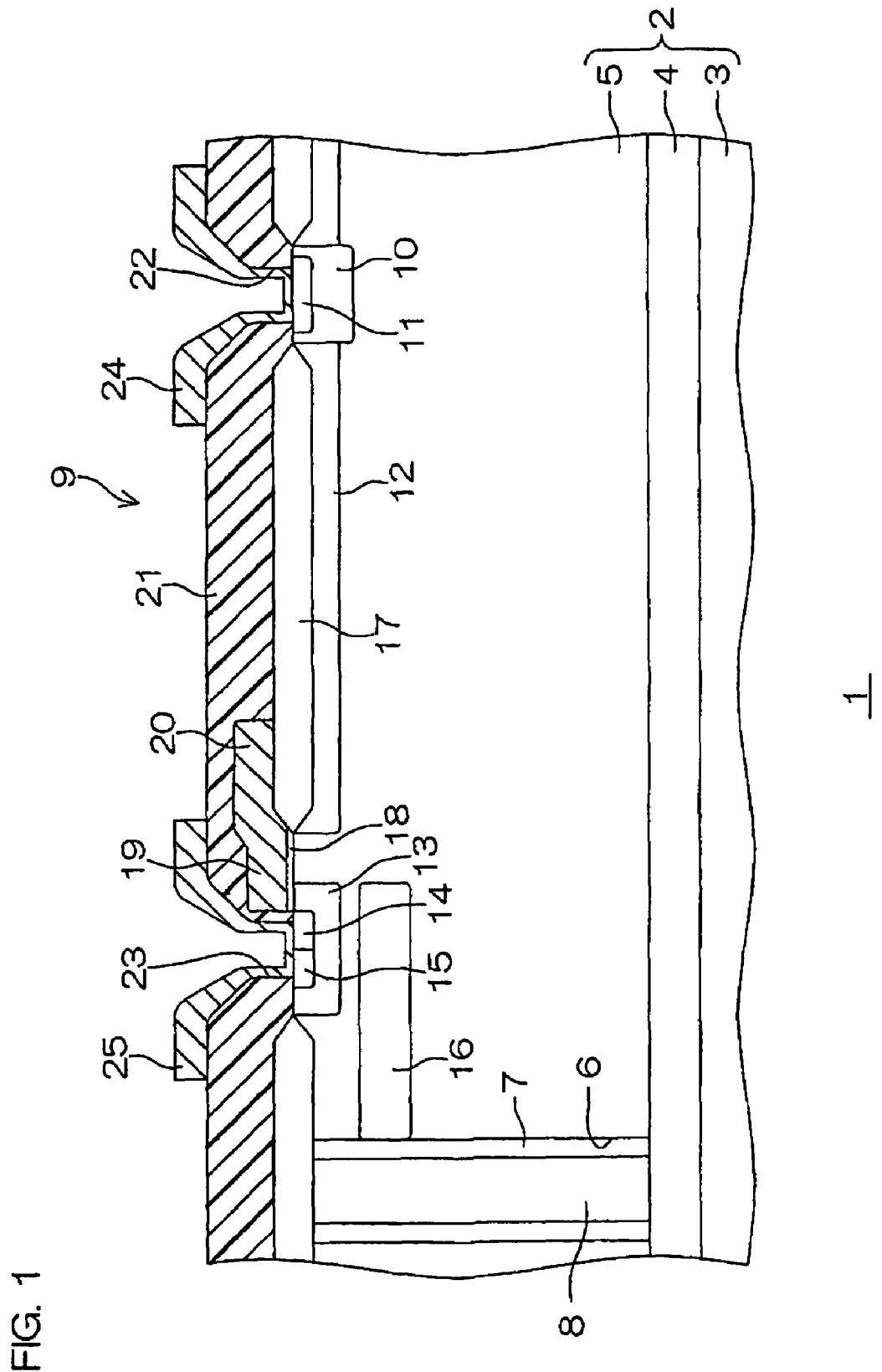
FIG. 1 is a schematic sectional view showing the structure of a semiconductor device according to a first embodiment of the present invention.

FIG. 1 is a schematic sectional view showing the structure of a semiconductor device 1 according to a first embodiment of the present invention.

The semiconductor device 1 includes a thick-film SOI substrate 2. The thick-film SOI substrate 2 has a structure formed by stacking an N-type epitaxial layer 5 made of Si on a P-type silicon substrate 3 through a BOX layer 4 as an insulating layer made of $SiO_2$. The N-type impurity concentration of the epitaxial layer 5 is $4E14/cm^3$, for example.

An annular deep trench 6 is formed in the epitaxial layer 5 as a semiconductor layer, to penetrate the epitaxial layer 5 in the thickness direction. In other words, the epitaxial layer 5 is provided with the annular trench 6 having a depth reaching the BOX layer 4 from the surface thereof. The inner side surface of the deep trench 6 is covered with a silicon oxide film 7. The inner side of the silicon oxide film 7 is filled up with polysilicon 8. Thus, the region surrounded by the deep trench 6 provides an element forming region 9 isolated (dielectrically insulated) from the periphery thereof by the BOX layer 4 and the silicon oxide film 7, so that an LDMOSFET is formed thereon.

In the element forming region 9, a P-type drain buffer region 10 is formed in a surface layer portion of the epitaxial layer 5 at the center in plan view. A P-type drain contact region 11 having a higher P-type impurity concentration than that of the drain buffer region 10 is formed in a surface layer portion of the drain buffer region 10.

A P-type drift region 12 is formed around the drain buffer region 10. The drift region 12 is in contact with the drain buffer region 10. The P-type impurity concentration of the drift region 12 is $5E16/cm^3$, for example.

In the surface layer portion of the epitaxial layer 5, an N-type body region 13 is formed between the deep trench 6 and the drift region 12 at intervals therefrom. In a surface layer portion of the body region 13, a P-type source region 14 and an N-type body contact region 15 having a higher N-type impurity concentration than that of the body region 13 are formed adjacently to each other. The N-type impurity concentration of the body region 13 is $5E17/cm^3$, for example.

An N-type high-concentration buried region 16 having a higher N-type impurity concentration than that of the epitaxial layer 5 is formed under the body region 13. The high-concentration buried region 16 has an N-type impurity concentration of $1E18$ to $1E20/cm^3$, for example, which is higher than the P-type impurity concentration of the drift region 12. The high-concentration buried region 16 is opposed to the overall body region 13 and the overall region located between the deep trench 6 and the body region 13 in the depth direction, and in contact with the deep trench 6.

The high-concentration buried region 16 can be formed by implanting an N-type impurity into the portion for forming the high-concentration buried region 16 in an intermediate stage of the growth of the epitaxial layer 5 and performing drive-in diffusion after completion of the growth of the epitaxial layer 5, for example.

A LOCOS oxide film 17 is formed on the overall drift region 12. Between the source region 14 and the LOCOS oxide film 17, a gate oxide film 18 is formed on the surface of the epitaxial layer 5. A gate electrode 19 is formed on the gate oxide film 18. A field plate 20 is formed on the LOCOS oxide film 17 integrally with the gate electrode 19.

The thick-film SOI substrate 2 is covered with an interlayer dielectric film 21 made of $SiO_2$. A drain contact hole 22 facing the drain contact region 11 and a source contact hole 23 facing the source region 14 and the body contact region 15 are penetratingly formed in the interlayer dielectric film 21.

A drain wire 24 and a source wire 25 are formed on the interlayer dielectric film 21. The drain wire 24 is connected to the drain contact region 11 through the drain contact hole 22. The source wire 25 is connected to the source region 14 and the body contact region 15 through the source contact hole 23.

When the source wire 25 is grounded and a negative voltage (drain voltage) is applied to the drain wire 24, a depletion layer spreads from the boundary between the epitaxial layer 5 and the drift region 12. The high-concentration buried region 16 is formed under the body region 13 and opposed to the overall body region 13 and the overall region located between the deep trench 6 and the body region 13 in the depth direction, whereby the depletion layer can be inhibited from extending toward the source region 14 from the portion between the portion opposed to the source region 14 in the depth direction and the deep trench 6. Thus, a withstand voltage higher than that of the conventional structure shown in FIG. 7 can be attained.

In the semiconductor device 1, further, no space is defined between the deep trench 6 and the high-concentration buried region 16, whereby the depletion layer can be inhibited from extending toward the source region 14 through the deep trench 6 and the high-concentration buried region 16. Thus, a high withstand voltage can be reliably attained.

Figure 2:
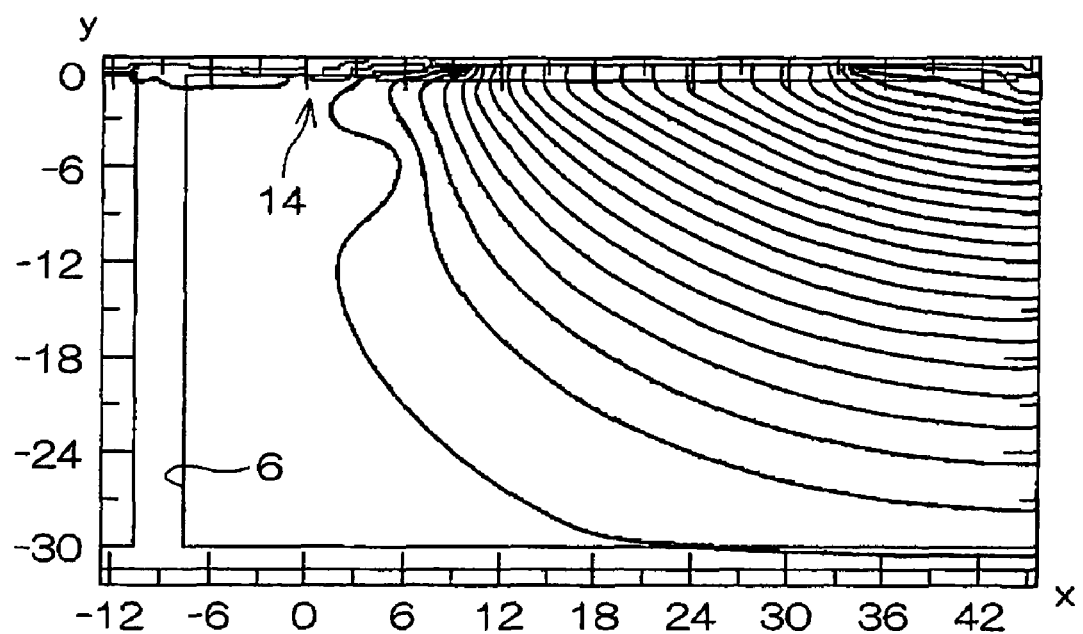
FIG. 2 is an equipotential diagram showing a potential distribution in an epitaxial layer upon application of a drain voltage in the semiconductor device shown in FIG. 1.

FIG. 2 is an equipotential diagram showing the potential distribution in the epitaxial layer upon application of the drain voltage.

When the drain voltage is applied, the portion of the epitaxial layer 5 closer to the deep trench 6 than the portion opposed to the source region 14 in the depth direction is generally equipotential, as sown in FIG. 2. Therefore, it is easily understood from the equipotential diagram shown in FIG. 2 that lateral extension of the depletion layer is suppressed.

Figure 3:
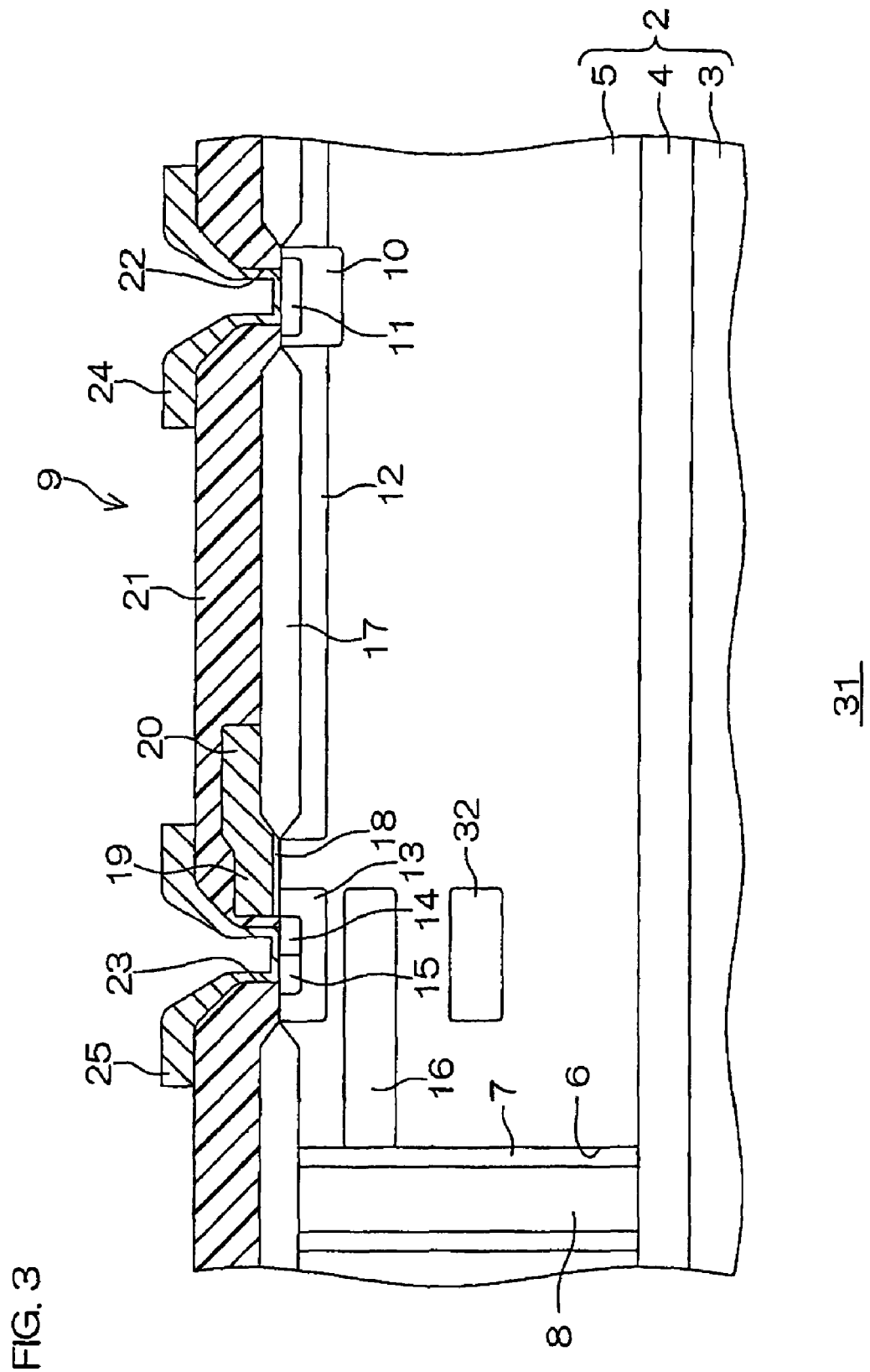
FIG. 3 is a schematic sectional view showing the structure of a semiconductor device according to a second embodiment of the present invention.

FIG. 3 is a schematic sectional view showing the structure of a semiconductor device 31 according to a second embodiment of the present invention. Referring to FIG. 3, portions corresponding to those shown in FIG. 1 are denoted by the same reference numerals. In the following, only points different from the structure shown in FIG. 1 are described in relation to the structure shown in FIG. 3, and redundant description is omitted as to the portions having the same reference numerals as the above.

In the semiconductor device 31 shown in FIG. 3, a second high-concentration buried region 32 having an impurity concentration generally identical to that of the high-concentration buried region 16 is formed under the high-concentration buried region 16 at an interval therefrom in the depth direction. The second high-concentration buried region 32 has the same shape as the body region 13 in plan view.

Thus, a depletion layer can be inhibited from extending toward a deep trench 6 beyond the high-concentration buried region 16 and the second high-concentration buried region 32, whereby a withstand voltage higher than that of the structure including no second high-concentration buried region 32 can be attained.

Figure 4:
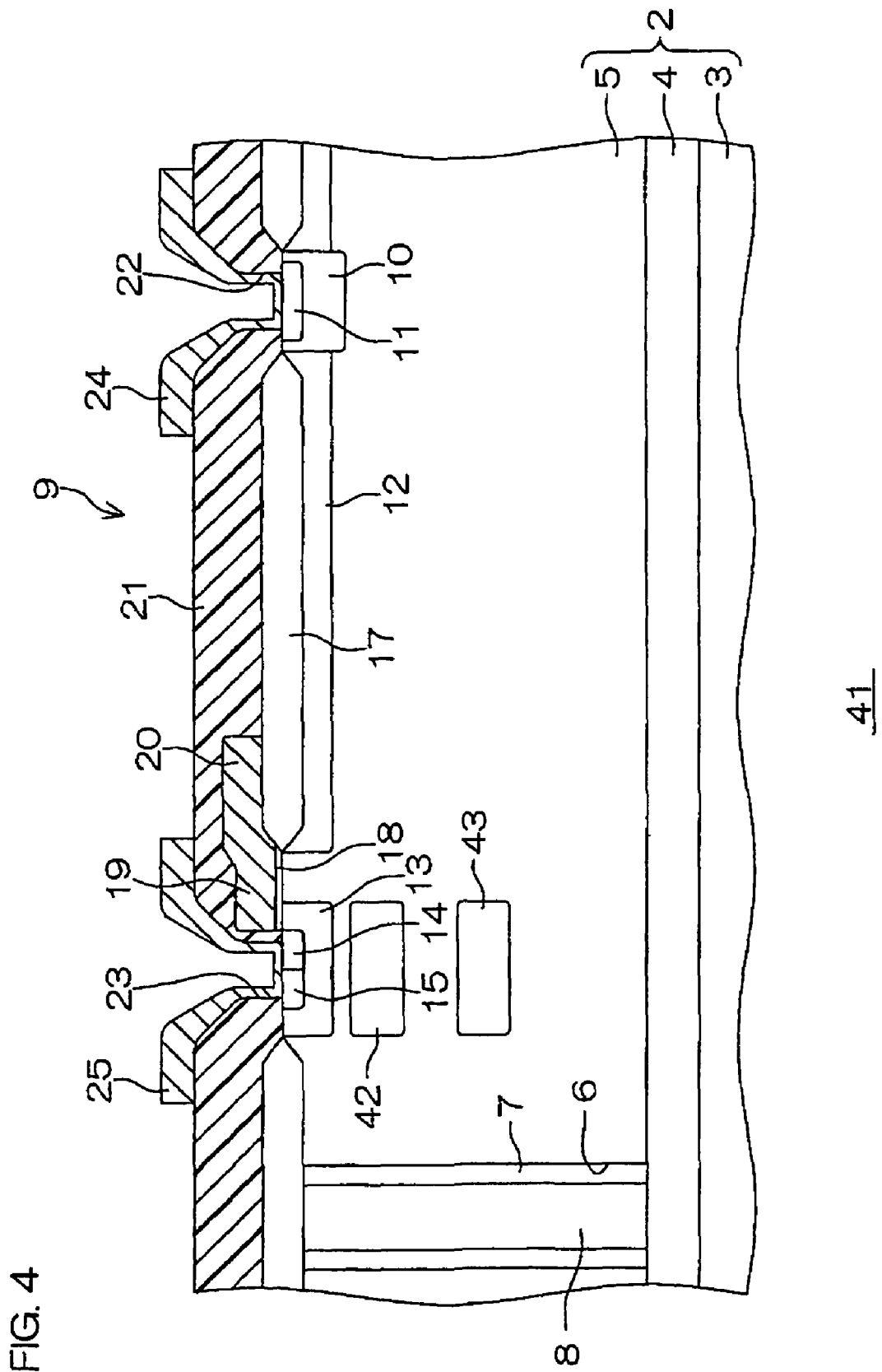
FIG. 4 is a schematic sectional view showing the structure of a semiconductor device according to a third embodiment of the present invention.

FIG. 4 is a schematic sectional view showing the structure of a semiconductor device 41 according to a third embodiment of the present invention. Referring to FIG. 4, portions corresponding to those shown in FIG. 1 are denoted by the same reference numerals. In the following, only points different from the structure shown in FIG. 1 are described in relation to the structure shown in FIG. 4, and redundant description is omitted as to the portions having the same reference numerals as the above.

In the semiconductor device 41 shown in FIG. 4, a first high-concentration buried region 42 is formed under the body region 13 at an interval therefrom, while a second high-concentration buried region 43 is formed under the first high-concentration buried region 42 at an interval therefrom. Each of the first and second high-concentration buried regions 42 and 43 has a higher N-type impurity concentration ($1E18$ to $1E20/cm^3$, for example) than that of the epitaxial layer 5, and has the same shape as the body region 13 in plan view.

Figure 7:
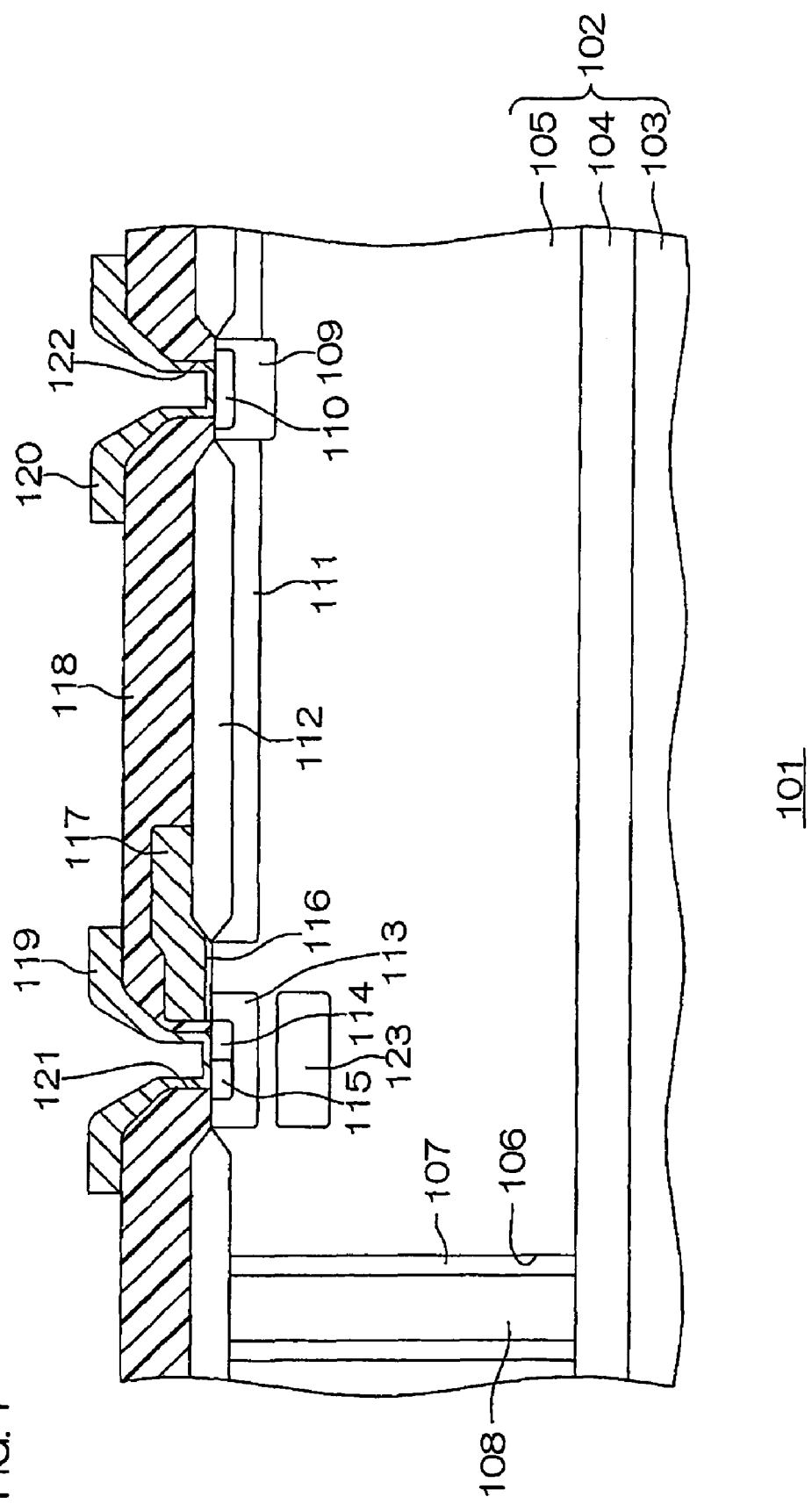
FIG. 7 is a schematic sectional view showing the structure of a conventional semiconductor device.
Figure 8:
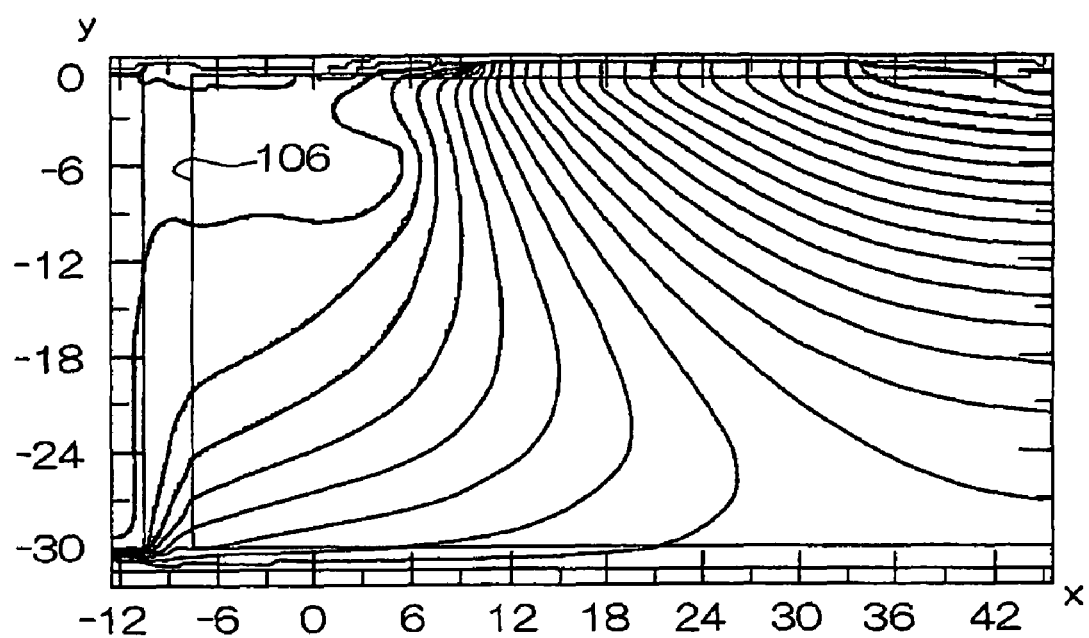
FIG. 8 is an equipotential diagram showing a potential distribution in an epitaxial layer upon application of a drain voltage in the semiconductor device shown in FIG. 7.

Thus, a depletion layer can be inhibited from extending toward the deep trench 6 beyond the first and second high-concentration buried regions 42 and 43, whereby a withstand voltage higher than that of the conventional structure shown in FIG. 7 can be attained.

Figure 5:
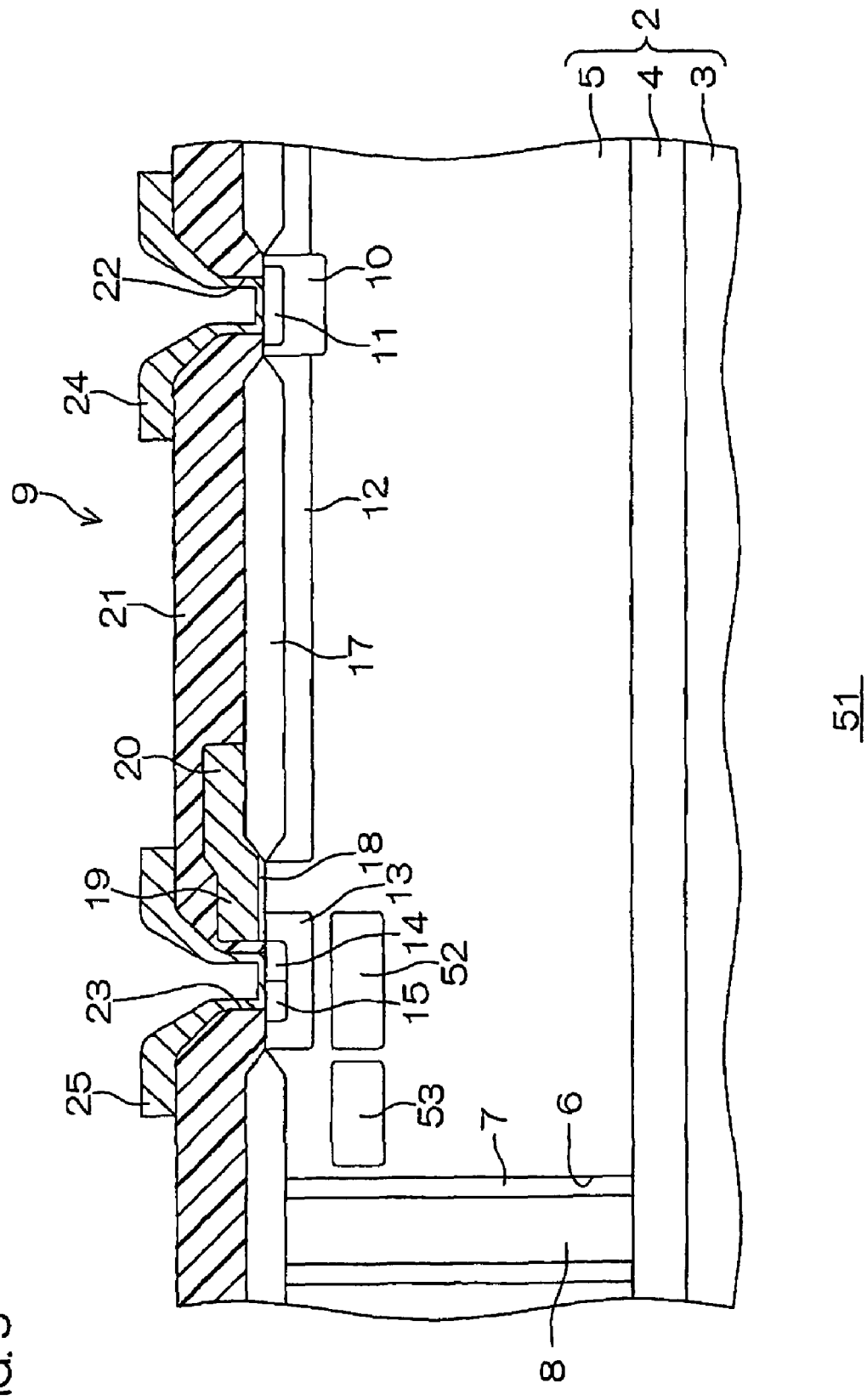
FIG. 5 is a schematic sectional view showing the structure of a semiconductor device according to a fourth embodiment of the present invention.

FIG. 5 is a schematic sectional view showing the structure of a semiconductor device 51 according to a fourth embodiment of the present invention. Referring to FIG. 5, portions corresponding to those shown in FIG. 1 are denoted by the same reference numerals. In the following, only points different from the structure shown in FIG. 1 are described in relation to the structure shown in FIG. 5, and redundant description is omitted as to the portions having the same reference numerals as the above.

In the semiconductor device 51 shown in FIG. 5, a first high-concentration buried region 52 is formed under a body region 13 at an interval therefrom. The first high-concentration buried region 52 has a higher N-type impurity concentration (1E18 to 1E20/cm³, for example) than that of the epitaxial layer 5, and has the same shape as the body region 13 in plan view. Further, a second high-concentration buried region 53 having an impurity concentration generally identical to that of the first high-concentration buried region 52 is formed between the deep trench 6 and the first high-concentration buried region 52.

Thus, a depletion layer can be inhibited from extending toward a source region 14 from the space between the deep trench 6 and the first high-concentration buried region 52, whereby a withstand voltage higher than that of the conventional structure shown in FIG. 7 can be attained.

Figure 6:
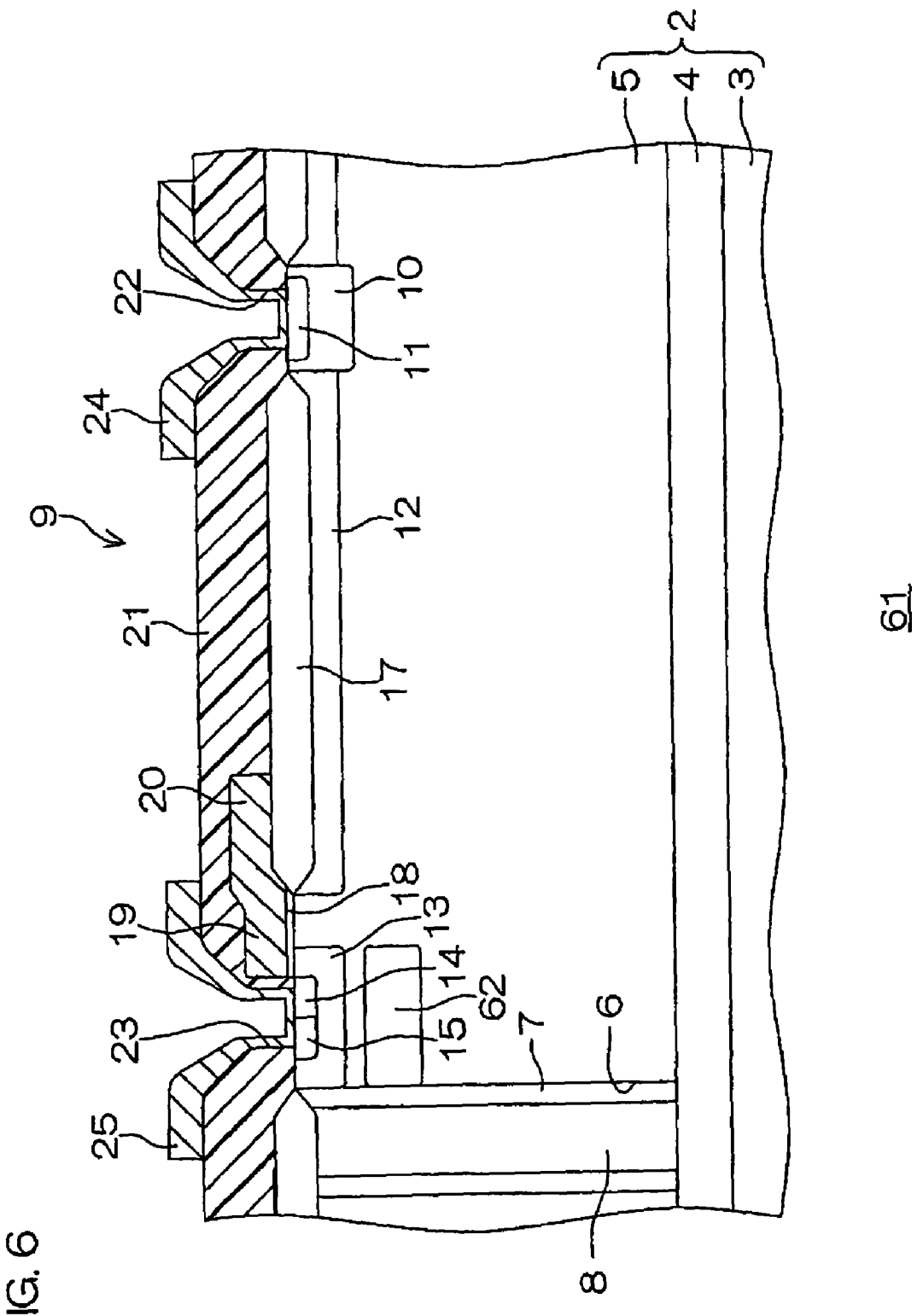
FIG. 6 is a schematic sectional view showing the structure of a semiconductor device according to a fifth embodiment of the present invention.

FIG. 6 is a schematic sectional view showing the structure of a semiconductor device 61 according to a fifth embodiment of the present invention. Referring to FIG. 6, portions corresponding to those shown in FIG. 1 are denoted by the same reference numerals. In the following, only points different from the structure shown in FIG. 1 are described in relation to the structure shown in FIG. 6, and redundant description is omitted as to the portions having the same reference numerals as the above.

In the semiconductor device 61 shown in FIG. 6, the body region 13 is formed in contact with the deep trench 6. A first high-concentration buried region 62 having a higher N-type impurity concentration (1E18 to 1E20/cm³, for example) than that of an epitaxial layer 5 is formed under the body region 13 at an interval therefrom. The first high-concentration buried region 62 has the same shape as the body region 13 in plan view, and is in contact with the deep trench 6.

Also in this structure, no space is defined between the deep trench 6 and the high-concentration buried region 62 similarly to the structure shown in FIG. 1, whereby a depletion layer can be inhibited from extending toward a source region 14 through the deep trench 6 and the high-concentration buried region 62. Therefore, a high withstand voltage can be reliably attained.

The conductivity types of the semiconductor portions of the semiconductor devices 1, 31, 41, 51 and 61 may be reversed. In other words, the P-type portions may be converted to N-type portions and vice versa in the semiconductor devices 1, 31, 41, 51 and 61.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-255346 filed with the Japanese Patent Office on Sep. 28, 2007, the disclosure of which is incorporated herein by reference.

What is claimed is:

1. A semiconductor device comprising:
   a semiconductor layer of a first conductivity type;
   an annular deep trench penetrating the semiconductor layer in the depth direction to surround an element forming region;
   a drain region of a second conductivity type formed in a surface layer portion of the semiconductor layer in the element forming region;
   a drift region of the second conductivity type formed in the surface layer portion of the semiconductor layer to come into contact with the drain region in the element forming region;
   a body region of the first conductivity type having a predetermined impurity concentration formed in the surface layer portion of the semiconductor layer at an interval from the drift region in the element forming region;
   a source region of the second conductivity type formed in a surface layer portion of the body region; and
   a first high-concentration buried region, formed in the semiconductor layer between a portion opposed to the source region in the depth direction and the deep trench, having an impurity concentration higher than said predetermined impurity concentration, the first high-concentration buried region being out of contact with the body region.

2. The semiconductor device according to claim 1, wherein the first high-concentration buried region is in contact with the deep trench.

3. The semiconductor device according to claim 1, further comprising a second high-concentration buried region, opposed to the first high-concentration buried region at an interval in the depth direction in the semiconductor layer, having a higher impurity concentration than that of the semiconductor layer.

4. The semiconductor device according to claim 1, wherein the first high-concentration buried region and the annular deep trench are separated from each other.

5. The semiconductor device according to claim 1, wherein said drain region includes
   a drain contact region having an impurity concentration formed in the surface layer portion of the semiconductor layer and
   a drain buffer region having an impurity concentration lower than the impurity concentration of the drain contact region, and surrounding the drain contact region in the semiconductor layer.

6. The semiconductor device according to claim 5, wherein said drain buffer region and said drift region are formed adjacent to each other.

7. The semiconductor device according to claim 6, further comprising a LOCOS oxide film formed on the entirety of said drift region.

8. The semiconductor device according to claim 7, further comprising a gate oxide layer formed between said source region and said LOCOS oxide film on the surface layer portion of the semiconductor layer.

9. The semiconductor device according to claim 8, further comprising a gate electrode formed on said gate oxide layer.

10. The semiconductor device according to claim 9, further comprising a field plate formed on said LOCOS oxide film.

11. The semiconductor device according to claim 10, wherein said field plate is formed integrally with said gate electrode.

12. The semiconductor device according to claim 1, wherein
   the drift region has an impurity concentration higher than that of the semiconductor layer, and
   the first high-concentration buried region has an impurity concentration higher than that of the drift region.

\* \* \* \* \*